United States Patent [19]
Gerstel et al.

[11] Patent Number: 5,880,406
[45] Date of Patent: Mar. 9, 1999

[54] COVER LAYER FOR ELECTRICAL CONDUCTORS OR SEMICONDUCTORS

[75] Inventors: Peter Gerstel, Rastatt; Ulrich Schonauer, Karlsruhe; Michael Tafferner, Malsch, all of Germany

[73] Assignee: Heraeus Electro-Nite International N.V., Houthalen, Belgium

[21] Appl. No.: 714,045

[22] PCT Filed: Dec. 29, 1995

[86] PCT No.: PCT/EP95/05165

§ 371 Date: Oct. 30, 1996

§ 102(e) Date: Oct. 30, 1996

[87] PCT Pub. No.: WO96/21149

PCT Pub. Date: Jul. 11, 1996

[30] Foreign Application Priority Data

Jan. 5, 1995 [DE] Germany .................. 195 00 235.0

[51] Int. Cl.[6] ................... H05K 1/00; G01N 27/26
[52] U.S. Cl. .................... 174/256; 174/258; 204/426
[58] Field of Search .................. 174/251, 253, 174/256, 258; 204/425, 426

[56] References Cited

U.S. PATENT DOCUMENTS

| 3,978,006 | 8/1976 | Topp et al. ............ 252/408.1 |
| 4,296,148 | 10/1981 | Friese .................. 427/125 |
| 4,943,330 | 7/1990 | Iino et al. ............ 204/426 X |
| 5,310,575 | 5/1994 | Friese et al. ........ 427/126.3 |

Primary Examiner—Hyung-Sub Sough
Attorney, Agent, or Firm—Antonelli, Terry, Stout & Kraus, LLP

[57] ABSTRACT

The invention relates to a protective coating on at least one electrical conductor and/or semiconductor, especially an electric sensor, in which a porous first protective coating is applied directly to the surface of the electrical conductor and/or semiconductor and a gas-tight second protective coating is applied at least to regions of the first protective coating.

41 Claims, 1 Drawing Sheet

COVER LAYER FOR ELECTRICAL CONDUCTORS OR SEMICONDUCTORS

BACKGROUND OF THE INVENTION

The present invention relates to a cover layer on at least one electrical conductor and/or semiconductor, especially of an electric sensor.

Cover layers for electrical conductors are known (DE-23 04 464 C2). They consist for example of barium-aluminum silicates, applied using the usual methods employed in ceramics technology. Such coatings are generally gas-tight cover layers.

In addition, porous cover layers are also known that consist for example of a metal, a metal alloy, an oxide, or a mixed oxide such as magnesium spinel, carbides, borides, nitrites of transition metals, or silicate minerals such as high-melting sintered glass or fireproof ceramic materials for example, which can also be applied as raw materials or mixtures of raw materials such as kaolin or talc, possibly with the addition of fluxes such as feldspar, nepheline syenite, or wollastonite, and then sintered.

In known protective layers, the gas-tight cover layer is applied to a solid electrolyte, while the porous first protective layer is located above the electrodes.

It has been found that when electrical conductors are covered with gas-tight cover layers, ions such as calcium, sodium, or oxygen ions migrate under the influence of the electrical voltages applied to the conductors, especially at higher temperatures, causing damage in the first protective layer and consequently in the conductors as well. In addition, discharges of oxygen ions can also release oxygen bubbles.

SUMMARY OF THE INVENTION

The goal of the present invention is to create cover layers in which ion migration is reduced in normal operating states.

In the cover layers according to the invention, a porous first protective layer is located directly on the surface of the electrical conductor and/or semiconductor and a gas-tight second protective layer is located at least areawise on the porous first protective layer.

Surprisingly, oxygen ion migration can be reduced by applying the porous first protective layer beneath the gas-tight second protective layer on the surface of the electrical conductor or semiconductor. As a result, the migration of oxygen ions between conductors with different potentials, and hence their harmful influence, can be reduced. In this connection it is theoretically immaterial whether the porous first protective layer is made with open or closed pores, although the open-pored state is more advantageous. If on the other hand the porous first protective layer is to be used to cover the electrodes and/or gas-sensitive layers of electrical sensors that measure gas, open-pored porosity is essential. The porous first protective layer contains 20 to 60 parts by weight of silicon dioxide, 28 to 75 parts by weight of aluminum oxide, and 1 to 27 parts by weight of barium oxide.

The gas-tight second protective layer contains 20 to 56 parts by weight of silicon dioxide, 28 to 75 parts by weight of aluminum oxide, and 2 to 55 parts by weight of barium oxide.

The first porous protective layer preferably contains 28 to 50 parts by weight of silicon dioxide and 30 to 65 parts by weight of aluminum oxide. The addition of barium oxide preferably is on the order of 2 to 20 parts by weight.

The gas-tight second protective layer preferably contains 28 to 50 parts by weight of silicon oxide and 30 to 65 parts by weight of aluminum oxide. The barium oxide content is on the order of 4 to 50 parts by weight of barium oxide. The porosity of the two protective layers can be controlled by the barium oxide content. The gas-tight second protective layer has a barium oxide content that is generally 2 to 8.5 times greater than that of the porous first protective layer.

The gas-tight second protective layer especially preferably contains 30 to 45 parts by weight of silicon dioxide, and especially 35 to 40 parts by weight of silicon dioxide. The aluminum oxide content of the gas-tight second protective layer is advantageously in the range from 30.0 to 65.0 parts by weight, especially preferably in the range from 40.0 to 60 parts by weight, and especially in the range from 47.0 to 53.0 parts by weight. The content of barium oxide is preferably in the range from 4 to 50 parts by weight, especially preferably in the range from 5 to 45 parts by weight, especially in the range from 10 to 30 parts by weight, and very specially in the range from 12 to 25 parts by weight.

The gas-tight second protective layer advantageously has a barium oxide content three to seven times greater than that of the porous first protective layer. Very especially preferably, the barium oxide content in the gas-tight second protective layer is preferably about 3.5 times greater.

The entire surface of the electrical conductor or semiconductor can be covered by the porous first protective layer, with the surfaces of the conductors or sensitive layers, for example temperature-sensitive conductors, semiconductors, or electrodes, e.g. measuring or reference electrodes, being covered by the porous first protective layer. The surfaces of the electrodes can also be kept clear of the porous first protective layer, however. These protective layers can be applied by any conventional application methods such as for example screen printing, dipping, or flame spraying methods, or by thin-film techniques, such as evaporation or sputtering. Especially advantageously, the protective layers are applied by coating methods using thick-film technology, such as screen printing for example. The gas-tight second protective layer is located on the porous first protective layer and can completely cover the latter, except for the electrode areas and the sensitive layers.

It has been found to be advantageous to adjust the content of silicon dioxide and aluminum oxide at least partially by adding kaolin that contains both aluminum oxide and silicon dioxide. The fine adjustment of the desired recipe is then performed by adding aluminum oxide, silicon dioxide, and barium oxide. The porosity of the protective layers is adjusted in particular by the barium oxide content. An increase in barium content within the limits specified above lowers the melting point and thus improves the sintering behavior. The lower the melting point, the less porous the mixtures will be after sintering. The protective layers are generally not heated to their melting points, but are sintered below the melting point, and form a glassy or crystalline oxide mixture of components.

BRIEF DESCRIPTION OF THE DRAWINGS

The invention will now be described in greater detail with reference to the drawing and the examples, wherein.

DETAILED DESCRIPTION OF THE PREFERRED EMBODIMENTS

Figure 1:
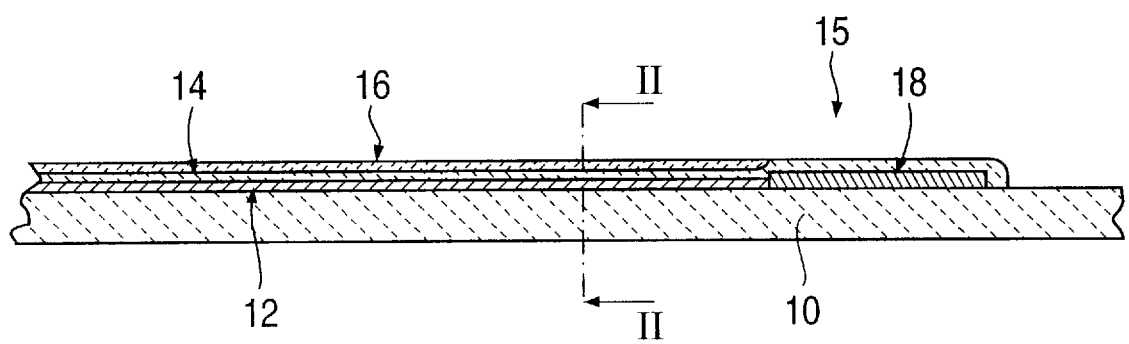
FIG. 1 shows a conductor with cover layers in a partially cutaway section.
Figure 2:
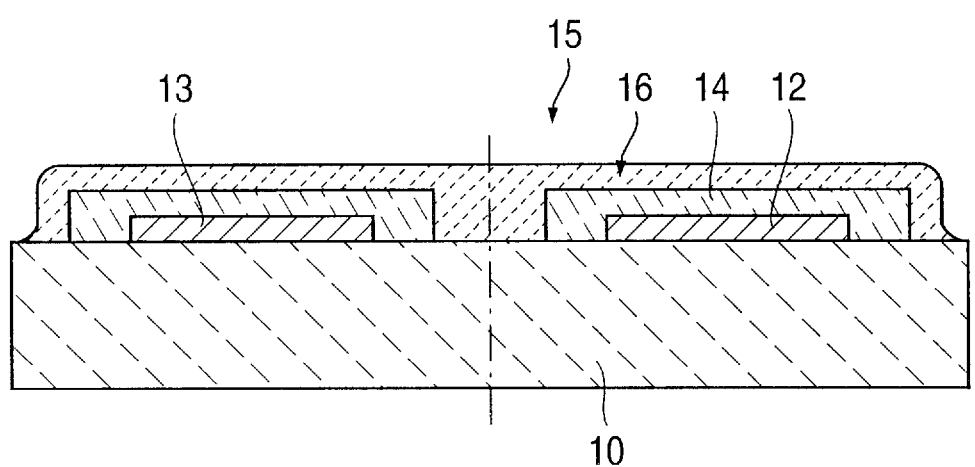
FIG. 2 is a section II—II according to FIG. 1.

An electrical sensor 15 is shown in FIG. 1 in a cutaway section. An electrical conductor 12 and 13 (FIG. 2) is mounted on a substrate 10 and extends to an electrode 18. A porous first protective layer 14 is applied on conductor 12, said layer also covering electrode 18 and extending on the sides of conductors 12, 13 up to substrate 10 (FIG. 2). A second protective layer 16 that is gas-tight but does not cover electrode 18 is applied at the remaining locations to the porous first protective layer 14 and also borders substrate 10 (FIG. 2).

EXAMPLE 1

Manufacture of the starting material for a porous layer 13.3 g of kaolin, 1.6 g of silicon dioxide, 5.9 g of aluminum oxide, and 1.0 g of barium carbonate were homogenized in a planetary ball mill by grinding. The mixture was then placed in a 300 ml agate beaker, reacted with 30 ml ethanol, and homogenized for eight hours after adding eight agate balls. The homogenized mixture was then calcined for ten hours at 1000° C. in a normal furnace atmosphere. The furnace was heated from room temperature to calcination temperature at a rate of 10K per minute and then allowed to cool to room temperature.

The powder produced by calcination was homogenized by grinding in a planetary ball mill. The powder was placed in a 250 ml agate beaker, reacted with 30 ml ethanol, and ground for twelve hours after adding eight agate balls. After grinding, the homogenized mixture was dried in a drying cabinet.

The dried powder was added in batches of 10 g to an 80 ml agate beaker, reacted with 6.5 g of a screen-printing medium made of terpene oil and ethyl cellulose, and then, after adding seven agate balls, homogenized for four hours in a planetary ball mill.

EXAMPLE 2

Screen Printing and Firing

The screen-printing paste manufactured according to Example 1 was applied by screen printing to an electrical conductor. Then the following sintering procedure was used:
1. Heat to 400° C. at a rate of 10K per minute;
2. Hold for 30 minutes at 400° C.;
3. Heat to 1330° C. at a rate of 5K per minute;
4. Hold for 60 minutes at 1330° C. (sintering);
5. Cool to 25° C. at a rate of 10K per minute.

In this fashion, a porous first protective layer was obtained on the conductor.

EXAMPLE 3

Production of a Porous Layer

In accordance with Example 1, a mixture of 13.6 g of kaolin, 1.8 g of silicon dioxide, 4.5 g of aluminum oxide, and 4.9 g of barium carbonate were homogenized and further processed into a screen-printing paste.

The printing of a conductor and the sintering of the porous first protective layer were performed according to Example 2 at a sintering temperature of 1280° C.

EXAMPLE 4

Production of Starting Material for a Gas-Tight Cover Layer 11.0 g of aluminum oxide, 8.0 g silicon dioxide, and 4.0 g barium carbonate were homogenized as in Example 1, calcined, and processed to form a screen-printing paste.

EXAMPLE 5

Production of starting material for a gas-tight layer 9.7 g of aluminum oxide, 6.8 g of silicon dioxide, and 8.4 g of barium carbonate were homogenized as in Example 1, calcined, and processed to form a screen-printing paste.

EXAMPLE 6

The screen printing pastes according to Examples 4 and 5 were applied according to Example 2 by screen printing to a porous protective layer obtained according to Example 2 and sintered as described in Examples 2 and 3.

By a combination of the porous layers according to Example 1 or 3, as well as the gas-tight layers according to Example 4 or 5, a two-layer system was obtained that has a porous first protective layer on the conductor and a gas-tight second protective layer on top of that.

We claim:

1. Cover layer on at least one electrical conductor and/or semiconductor, characterized in that a porous first protective layer (14) is applied as a cover layer directly to the surface of an electrical conductor and/or semiconductor (12), and a gas-tight second protective layer (16) is provided on the porous first protective layer (14), and characterized in that the porous first protective layer (14) has the following composition:

20–60 parts by weight of silicon dioxide
   28–75 parts by weight of aluminum oxide
   1–27 parts by weight of barium oxide.

2. Cover layer according to claim 1, further comprising an electrode (18) in contact with the electrical conductor and/or semiconductor (12), characterized in that the gas-tight second protective layer (16) does not cover the electrode (18).

3. Cover layer according to claims 2 or 3, characterized in that the porous first protective layer (14) contains 30 to 65 parts by weight aluminum oxide.

4. Cover layer according to claim 3, characterized in that the porous first protective layer (14) contains 40 to 60 parts by weight aluminum oxide.

5. Cover layer according to claim 4, characterized in that the porous first protective layer (14) contains 54.0 to 59.0 parts by weight aluminum oxide.

6. Cover layer on at least one electrical conductor and/or semiconductor, characterized in that a porous first protective layer (14) is applied as a cover layer directly to the surface of an electrical conductor and/or semiconductor (12), and a gas-tight second protective layer (16) is provided on the porous first protective layer (14), and characterized in that the gas-tight second protective layer (16) has the following composition:

20–56 parts by weight of silicon dioxide
   28–75 parts by weight of aluminum oxide
   2–55 parts by weight of barium oxide provided that the amount by weight of barium oxide in the gas-tight second protective layer (16) is approximately 2 to 8.5 times greater than that in the porous first protective layer (14).

7. Cover layer according to one of claims 1 or 6, characterized in that the silicon dioxide and aluminum oxide content is at least partially established by addition of kaolin.

8. Cover layer according to claim 6, wherein the gas-tight second protective layer (16) is not in contact with the electrical conductor and/or semiconductor (12).

9. Cover layer on at least one electrical conductor and/or semiconductor, characterized in that a porous first protective layer (14) is applied as a cover layer directly to the surface of an electrical conductor and/or semiconductor (12), and a gas-tight second protective layer (16) is provided on the porous first protective layer (14), and characterized in that the gas-tight second protective layer (16) contains from 28 to 50 parts by weight of silicon dioxide.

10. Cover layer according to claim 5, characterized in that the gas-tight second protective layer (16) contains from 30 to 45 parts by weight of silicon dioxide.

11. Cover layer according to claim 10, characterized in that the gas-tight second protective layer (16) contains from 35 to 40 parts by weight of silicon dioxide.

12. Cover layer on at least one electrical conductor and/or semiconductor, characterized in that a porous first protective layer (14) is applied as a cover layer directly to the surface of an electrical conductor and/or semiconductor (12), and a gas-tight second protective layer (16) is provided on the porous first protective layer (14), and characterized in that the gas-tight second protective layer (16) contains from 30 to 65 parts by weight of aluminum oxide.

13. Cover layer according to claim 12, characterized in that the gas-tight second protective layer (16) contains from 40 to 60 parts by weight of aluminum oxide.

14. Cover layer according to claim 13, characterized in that the gas-tight second protective layer (16) contains from 47.0 to 53.0 parts by weight of aluminum oxide.

15. Cover layer on at least one electrical conductor and/or semiconductor, characterized in that a porous first protective layer (14) is applied as a cover layer directly to the surface of an electrical conductor and/or semiconductor (12), and a gas-tight second protective layer (16) is provided on the porous first protective layer (14), and characterized in that the gas-tight second protective layer (16) contains from 4 to 50 parts by weight of barium oxide.

16. Cover layer according to claim 15, characterized in that the gas-tight second protective layer (16) contains from 5 to 45 parts by weight of barium oxide.

17. Cover layer according to claim 16, characterized in that the gas-tight second protective layer (16) contains from 10 to 30 parts by weight of barium oxide.

18. Cover layer according to claim 17, characterized in that the gas-tight second protective layer (16) contains from 12 to 25 parts by weight of barium oxide.

19. Cover layer on at least one electrical conductor and/or semiconductor, characterized in that a porous first protective layer (14) is applied as a cover layer directly to the surface of an electrical conductor and/or semiconductor (12), and a gas-tight second protective layer (16) is provided on the porous first protective layer (14), and characterized in that the porous first protective layer (14) contains from 28 to 50 parts by weight of silicon dioxide.

20. Cover layer according to claim 19, characterized in that the porous first protective layer (14) contains from 30 to 45 parts by weight of silicon dioxide.

21. Cover layer according to claim 20, characterized in that the porous first protective layer (14) contains from 35 to 40 parts by weight of silicon dioxide.

22. Cover layer on at least one electrical conductor and/or semiconductor, characterized in that a porous first protective layer (14) is applied as a cover layer directly to the surface of an electrical conductor and/or semiconductor (12), and a gas-tight second protective layer (16) is provided on the porous first protective layer (14), and characterized in that the porous first protective layer (14) contains 2 to 20 parts by weight barium oxide.

23. Cover layer according to claim 22, characterized in that the porous first protective layer (14) contains 2.5 to 15 parts by weight barium oxide.

24. Cover layer according to claim 23, characterized in that the porous first protective layer (14) contains 3 to 10 parts by weight barium oxide.

25. Cover layer on at least one electrical conductor and/or semiconductor, characterized in that a porous first protective layer (14) is applied as a cover layer directly to the surface of an electrical conductor and/or semiconductor (12), and a gas-tight second protective layer (16) is provided on the porous first protective layer (14), and characterized in that the barium oxide content of the gas-tight second protective layer (16) is 3 to 7 times larger than that of the porous first protective layer (14).

26. Cover layer according to claim 25, characterized in that the barium oxide content of the gas-tight second protective layer (16) is approximately 3.5 times larger than that of the porous first protective layer (14).

27. Cover layer on at least one electrical conductor and/or semiconductor, characterized in that a porous first protective layer (14) is applied as a cover layer directly to the surface of an electrical conductor and/or semiconductor (12), and a gas-tight second protective layer (16) is provided on the porous first protective layer (14), and characterized in that the electrical conductor (12, 13) applied to a substrate (10) is fully covered by the porous first protective layer (14) and the latter is fully covered by the gas-tight second protective layer (16).

28. An electrical device, comprising:

an electrical conductor and/or semiconductor;

a porous first protective cover layer provided directly over a surface of the electrical conductor and/or semiconductor; and a gas-tight second protective cover layer provided over the porous first protective cover layer, wherein the gas-tight second protective cover layer is not in contact with the electrical conductor and/or semiconductor, being separated therefrom by the porous first protective cover layer, wherein the porous first protective cover layer and the gas-type second protective cover layer each comprises silicon dioxide, aluminum oxide and barium oxide, the gas-tight second protective cover layer containing more barium oxide than the porous first protective cover layer, and wherein the porous first protective cover layer comprises 20–60 parts by weight silicon dioxide, 28–75 parts by weight aluminum oxide and 1–27 parts by weight barium oxide.

29. An electrical device according to claim 28, wherein the electrical device is an electrical sensor and further comprises a substrate over which the electrical conductor and/or semiconductor is provided.

30. An electrical device according to claim 29, further comprising an electrode provided over the substrate and in contact with the electrical conductor and/or semiconductor, wherein the gas-tight second protective cover layer does not cover the electrode.

31. An electrical device according to claim 30, wherein the porous first protective cover layer covers the electrode.

32. An electrical device according to claim 31, wherein the gas-tight protective cover layer covers all of the porous first protective cover layer except in an area over the electrode.

33. An electrical device according to claim 31, wherein the porous first protective cover layer has open-pored porosity.

34. An electrical device according to claim 33, wherein the electrode is a measuring or reference electrode.

35. An electrical device according to claim 28, wherein the gas-tight second protective cover layer comprises 20–56 parts by weight silicon dioxide, 28–75 parts by weight aluminum oxide and 2–55 parts by weight barium oxide.

36. An electrical device according to claim 35, wherein the amount by weight of barium oxide in the gas-tight second protective cover layer is 2 to 8.5 times greater than in the porous first protective cover layer.

37. An electrical device, comprising:

an electrical conductor and/or semiconductor;

a porous first protective cover layer provided directly over a surface of the electrical conductor and/or semiconductor; and a gas-tight second protective cover layer provided over the porous first protective cover layer, wherein the gas-tight second protective cover layer is not in contact with the electrical conductor and/or semiconductor, being separated therefrom by the porous first protective cover layer, wherein the porous first protective cover layer and the gas-type second protective cover layer each comprises silicon dioxide, aluminum oxide and barium oxide, the gas-tight second protective cover layer containing more barium oxide than the porous first protective cover layer, and wherein the gas-tight second protective cover layer comprises 20–56 parts by weight silicon dioxide, 28–75 parts by weight aluminum oxide and 2–55 parts by weight barium oxide.

38. An electrical device according to claim 37, wherein the electrical device is an electrical sensor and further comprises a substrate over which the electrical conductor and/or semiconductor is provided.

39. An electrical device according to claim 38, further comprising an electrode provided over the substrate and in contact with the electrical conductor and/or semiconductor, wherein the gas-tight second protective cover layer does not cover the electrode.

40. An electrical device according to claim 39, wherein the porous first protective cover layer covers the electrode.

41. An electrical device according to claim 40, wherein the gas-tight protective cover layer covers all of the porous first protective cover layer except in an area over the electrode.

* * * * *